March 27, 1973 M. B. VORA 3,723,199

OUTDIFFUSION EPITAXIAL SELF-ISOLATION TECHNIQUE FOR MAKING MONOLITHIC SEMICONDUCTOR DEVICES

Filed Nov. 10, 1969 2 Sheets-Sheet 1

INVENTOR
MADHUKAR B. VORA

BY Robert J. Haase
ATTORNEY

United States Patent Office 3,723,199
Patented Mar. 27, 1973

3,723,199
OUTDIFFUSION EPITAXIAL SELF-ISOLATION TECHNIQUE FOR MAKING MONOLITHIC SEMICONDUCTOR DEVICES

Madhukar B. Vora, Beacon, N.Y., assignor to International Business Machines Corporation, Armonk, N.Y.
Filed Nov. 10, 1969, Ser. No. 875,012
Int. Cl. H01l 7/00, 7/64, 19/00
U.S. Cl. 148—175 9 Claims

ABSTRACT OF THE DISCLOSURE

A subcollector window is opened in an oxide covered P− silicon substrate. Two N dopants of different diffusion rates (arsenic and phosphorous) are diffused through the window into the substrate. The oxide covering is removed and a P− silicon epitaxial layer is deposited on the substrate and reoxidized. During the reoxidation cycle, the phosphorous and arsenic are out-diffused, the phosphorus reaching the top surface of the epitaxial layer to produce an N pocket in the P− epitaxial layer and substrate, the pocket having a heavily doped N+ region adjacent the epitaxial layer-substrate interface. Base and emitter diffusions are made within the N pocket to form a transistor.

BACKGROUND OF THE INVENTION

The art of manufacturing monolithic semiconductor integrated circuit devices is being pressed forward toward increasing component packing density wtihout sacrificing high electrical performance qualities. As is well known, electrical isolation must be provided between adjacent individual semiconductor devices which are formed in the same monolithic chip, in order that device interconnections may be controlled in a desired manner by surface metallization. Electrical isolation ordinarily is achieved by the provision of special isolation diffusions which reach through an epitaxial layer of one conductivity type to an underlying substrate of the opposite conductivity type, each isolation diffusion being of a conductivity type opposite that of the epitaxial layer. Such isolation diffusions, however, occupy and thus render unavailable for circuit component use significant portions of the epitaxial layer bulk material. Component density is substantially increased where self-isolation is achieved between adjacent semiconductor devices without providing separate isolation diusions between the individual elements. Such isolation is achieved by the techniques disclosed in co-pending U.S. patent applications Ser. No. 837,803 filed June 30, 1969 for Isolated Structure for Devices in Integrated Circuits and Fabrication Methods Therefor in the names of B. Agusta, D. DeWitt, M. Hess and R. Pecoraro, and Ser. No. 837,572 filed June 30, 1969 for An Inverted Transistor Structure and Fabrication Method Therefor in the name of B. Agusta and assigned to the present assignee, wherein the boundaries of the collector and emitter regions, respectively, provide the necessary isolation.

It will be appreciated that the manner in which electrical isolation is achieved between the elements of a monolithic structure should be compatible with the achievement of high electrical performance of the isolated devices. It can be shown, for example, that a retrograded impurity gradient is desirable in the collector region of a transistor in order to increase cut off frequency and current carrying characteristics. Such a gradient is one wherein the impurity concentration decreases from a maximum in the subcollector region toward a minimum at the collector junction. This desirable impurity profile is not achieved by prior art processes wherein self-isolated devices are formed in the epitaxial layer of a monolithic crystalline structure.

SUMMARY OF THE INVENTION

Self-isolation consistent with high device packing density and high electrical device performance is achieved by an out-diffusion epitaxial process in which two dopants of one conductivity type are placed in a substrate of the opposite conductivity type in those regions underlying locations at which isolated pockets of said one conductivity type are to be formed in an epitaxial layer grown over the substrate. The two dopants are characterized by substantially different diffusion rates and by different initial concentrations in the substrate. More particularly, the dopant of lower diffusion rate has the higher concentration whereas the dopant with the higher diffusion rate has the lower concentration. In a preferred embodiment, arsenic and phosphorus (having lower and higher diffusion rates, respectively) are diffused with appropriate concentrations at desired locations on a P− silicon substrate. A P− epitaxial silicon layer is deposited on the doped substrate and the arsenic and phosphorus are out-diffused through the epitaxial layer until the faster diffusing phosphorus reaches the upper surface of the epitaxial layer. In this manner, an N conductivtiy type pocket is formed in a P− epitaxial layer on a P− substrate. Desired semiconductor devices can be formed in respective isolated N pockets by additional and conventional processing steps well known to those skilled in the art.

An important structural feature of the present invention results from the fact that each isolated pocket is produced by out-diffusion of dopant upwards from the epitaxial layer-substrate interface rather than by downward diffusion of dopants from the upper surface of the epitaxial layer. Said out-diffusion produces an N pocket characterized by a retrograded impurity profile which varies from a relatively heavily doped (N+) bottom region toward a relatively light doped (N) upper region. The retrograded profile significantly enhances the electrical performance characteristics of a transistor which is later formed in the isolated pocket. Of course, devices other than transistors also may be formed within respective isolated pockets in accordance with circuit design requirements.

DESCRIPTION OF THE PREFERRED EMBODIMENT

Figure 1A:
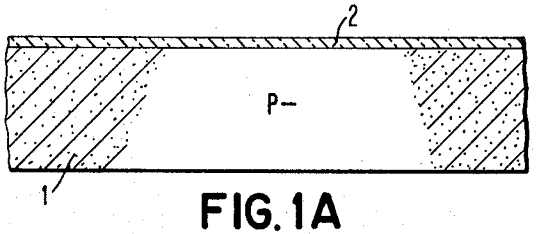
FIG. 1 is a series of simplified cross-sectional views of a typical self-isolated transistor device as it appears at successive times during the execution of the present method.
Figure 1E:
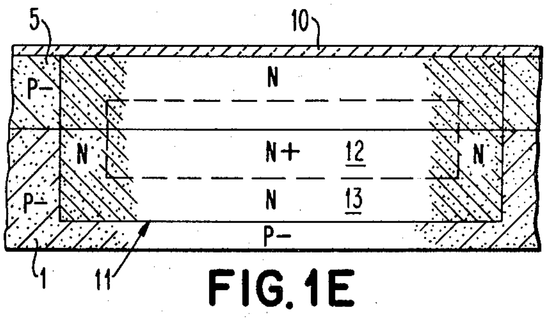
Figure 1B:
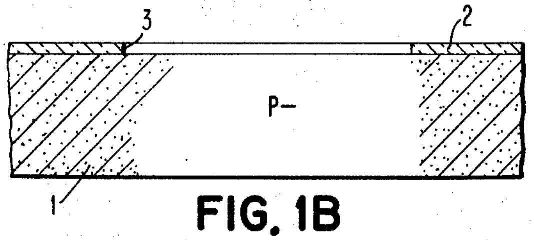
Figure 1F:
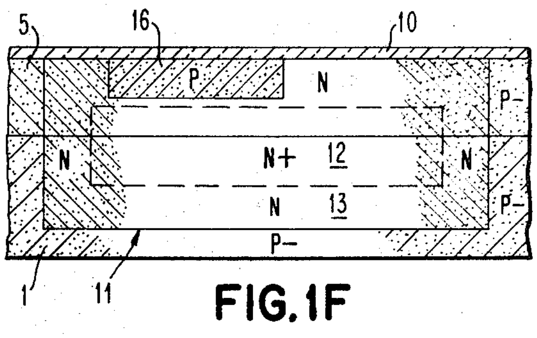
Figure 1C:
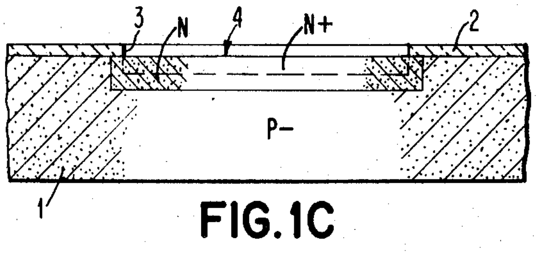
Figure 2:
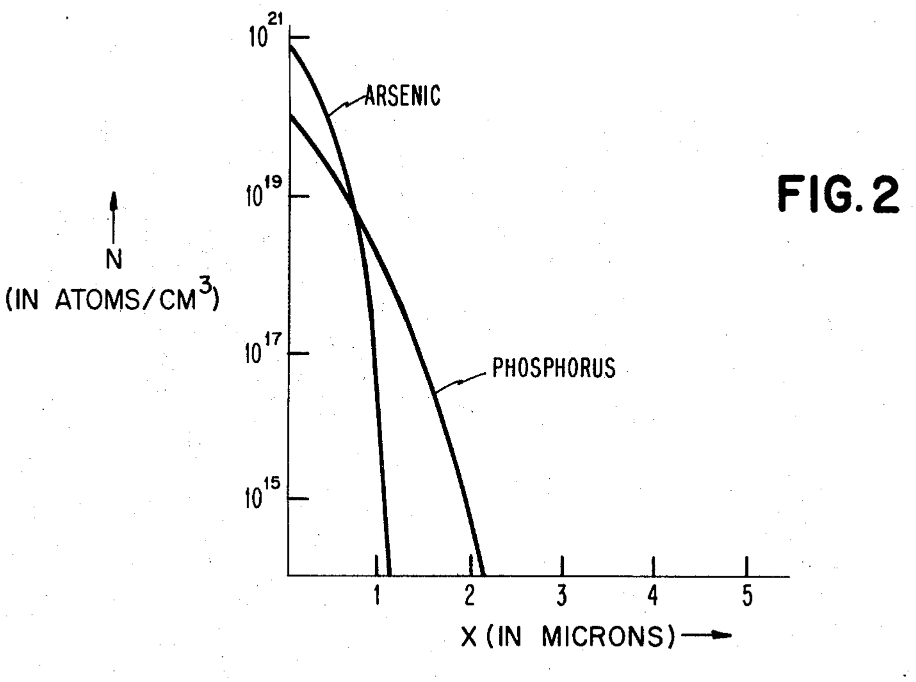
FIG. 2 is a plot of the impurity profile obtaining at an interim point in the method as represented in FIG. 1.

Referring to FIG. 1A, a P− silicon substrate 1 (impurity concentration no greater than about $10^{15}$ atoms per cubic centimeter) having a surface resistivity of about 10 ohm centimeters is initially oxidized with a layer of silicon dioxide 2. A window 3 is etched in oxide 2 by conventional photoresist techniques as shown in FIG. 1B. Arsenic and phosphorus 4 are diffused through window 3 into substrate 1 by well known techniques as in FIG. 1C. Representative impurity profiles are depicted in FIG. 2 for the arsenic and phosphorus in substrate 1 at this point in the process.

Figure 1G:
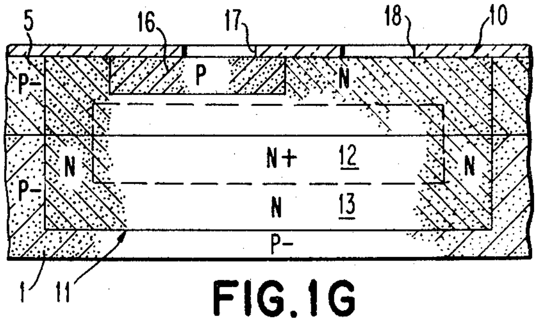
Figure 1D:
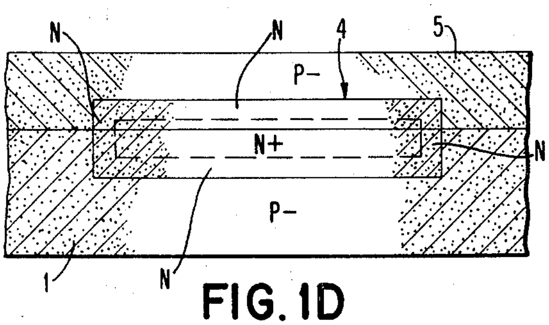
Figure 3:
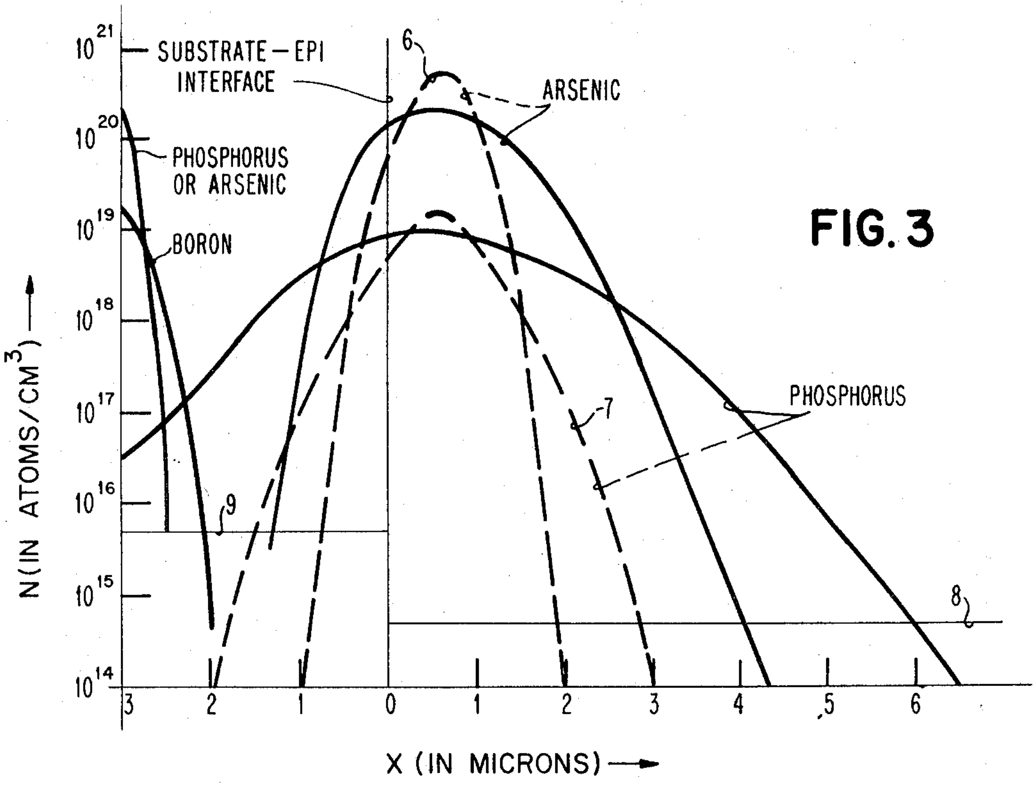
FIG. 3 is a plot of the impurity profile of the completed transistor device made in accordance with the present invention.

Next, the oxide coating 2 is stripped from the substrate and a $P^-$ epitaxial layer 5 is grown as shown in FIG. 1D. Typical impurity profiles of the arsenic and phosphorus as well as the background dopant concentrations in substrate 1 and in epitaxial layer 5 are shown in FIG. 3. Dotted curves 6 and 7 represent the arsenic and phosphorus profiles, respectively, whereas lines 8 and 9 represent the $P^-$ substrate doping and the $P^-$ epitaxial layer doping, respectively. In the next step of the process of the present invention, oxide layer 10 is formed on the top surface of epitaxial layer 5 and the arsenic and phosphorus impurities are out-diffused until the phosphorus reaches fully through epitaxial layer 5 to the top surface thereof as shown in FIG. 1E. At this point, an isolated pocket of N conductivity type material 11 is formed within $P^-$ epitaxial layer 5 and $P^-$ substrate 1.

The isolated pocket is characterized by a region 12 of relatively heavily doped $N^+$ type conductivity material (impurity concentration of about $10^{20}$ atoms per cubic centimeter) comprising arsenic and phosphorus 3 and region 13 having a relatively lower N type impurity concentration (of about $10^{17}$ atoms per cubic centimeter) comprising out-diffused phosphorus. In accordance with circuit design requirements, various semiconductor circuit elements can be formed within respective isolated pockets such as pocket 11. A transistor, for example, may be formed by opening a window in oxide layer 10 and then proceeding with conventional base diffusion to provide P conductivity type base region 16 within N conductivity type collector region 13 as shown in FIG. 1F. Boron is a suitable impurity for the aforesaid base diffusion step. Emitter and collector contact diffusions are made through respective windows 17 and 18 in oxide layer 2 of FIG. 1G to form the completed transistor structure depicted by FIG. 1H. Phosphorus or arsenic is suitable for making the $N^+$ emitter and collector contact diffusions 19 and 20, respectively. The completed transistor structure typically is characterized by the following parameter values: epitaxial layer thickness 3 microns; epitaxial layer resistivity 1 ohm-centimeter; collective junction depth 30 microinches; emitter junction depth 16 microinches; base width 14 microinches.

It should be noted that the fabrication parameters including the impurity profiles discussed in the foregoing specification are exemplary only. In general, the background doping levels of the substrate and of the epitaxial layer and the initial concentration of the dopant (arsenic and phosphorus, for example) in the substrate, and the junction depth, etc. may be varied in accordance with established design considerations determined by the nature of the semiconductor device which is to be formed in a respective isolated N pocket. With regard to the initial concentration of the arsenic introduced into the substrate, it has been observed that high concentrations in excess of about $10^{21}$ atoms per cubic centimeter gives rise to a lateral spreading of the arsenic along the interface between the epitaxial layer and the substrate during the time that the epitaxial layer is being grown. Such spreading is undesirable inasmuch as it tends to increase the design distance between adjacent isolated N pockets and, in the worst case, might even reach between and thereby short circuit adjacent N pockets together. This problem can be avoided in a number of ways some of which are outlined in Silicon Semiconductor Technology by W. R. Runyan, McGraw-Hill, 1965, p. 70. Perhaps the simplest method is to reduce the value of the initial arsenic surface concentration below $10^{21}$ atoms per cubic centimeter.

The present invention provides flexibility in the manner in which the two dopants (for example, arsenic and phosphorus) are introduced into the substrate. The two dopants may be introduced by simultaneous diffusion from a mixed source or, alternatively, each may be introduced from a respective source at successive times. The latter technique is employed in the following typical detailed procedure which was used to produce a self-isolated bipolar transistor in accordance with the method of the present invention. A wafer was provided of 10 ohms centimeter, $P^-$ (about $10^{15}$ atoms per cubic centimeter) boron doped [100] silicon wafer. The wafer was initially oxidized at 970° C. to produce a 5000 A. silicon dioxide layer over the wafer. The oxide was masked and etched in a conventional manner to open a window through which phosphorus was diffused using an open tube $POCl_3$ system for 30 minutes at a temperature of 900° C. This diffusion produced a surface resistivity of 40 ohms per square and a junction depth of 0.015 mil. The $P_2O_5$ glass which formed over the oxide coated wafer during the phosphorus diffusion step was removed and then arsenic was diffused through the same window in the oxide by a capsule method using a 1% arsenic source for 5 hours at a temperature of 1100° C. This second diffusion reduced the surface resistivity of the doped substrate to 4 ohms per square and deepened the junction depth to 0.11 mil.

Upon the completion of the second diffusion, the wafer was oxidized and the arsenic and phosphorus dopants were driven in at a temperature of 1200° C. in the successive atmospheres of oxygen for 15 minutes, steam for 24 minutes, and then oxygen for 5 additional minutes. This treatment resulted in a surface resistivity of the substrate of about 3.2 ohms per square and a deepened junction of 0.3 mil below the substrate surface. A silicon epitaxial layer next was deposited on the substrate at about 1200° C. to provide a 3 micron thickness. The epitaxial layer was oxidized to produce a 4750 A. thickness of silicon dioxide at a temperature of 1200° C. in the successive atmospheres of oxygen for 40 minutes, steam for 15 minutes, followed by oxygen for 5 additional minutes. During the same oxide growth cycle, the arsenic and phosphorus dopants in the substrate were out-diffused into the epitaxial layer until the faster-diffusing dopant (phosphorus) reached the upper surface of the epitaxial layer to provide an isolated N pocket within the P epitaxial layer and substrate.

A transistor was formed within the N pocket by standard photoresist and etching techniques followed by a boron diffusion by capsule method at a temperature of 1000° C. for 60 minutes, producing a surface resistivity of 72 ohms per square and a collector junction depth of 0.015 mil beneath the surface of the epitaxial layer. The device was then oxidized at a temperature of 1000° C. in the successive atmospheres of oxygen for 5 minutes, steam for 40 minutes, followed by oxygen for 5 minutes. The resulting surface resistivity was 212 ohms per square and the collector junction depth was deepened to 0.030 mil. A window was then formed in the oxide layer produced during the base oxidation and drive-in step for an emitter deposition using phosphorus in an open tube $POCl_3$ system at a temperature of 900° C. for 20 minutes. The emitter deposition step resulted in surface resistivity of 67 ohms per square, an emitter junction depth of 0.011 mil and an encapsulating layer of $P_2O_5$ glass 400 A. thick. Lastly, emitter oxidation and drive-in was achieved at 900° C. in the successive atmospheres of oxygen for 5 minutes followed by steam for 20 minutes and then oxygen for 5 minutes. The resulting resistivity was 45 ohms per square with an emitter junction depth of 0.016 mil and a base width of 14 microinches.

Some typical parameters of a self-isolated transistor produced by the foregoing method are:

| | |
|---|---|
| Small signal common emitter current gain (Hfe) | 22. |
| Frequency at which Hfe is equal to unity | 630 mHz. |
| Collector base breakdown voltage with open emitter | 14 volts. |
| Emitter base breakdown voltage with open collector | 6 volts. |
| Collector emitter breakdown voltage with base shorted | 14 volts. |
| Collector emitter breakdown voltage with open base | 6 volts. |
| Collector substrate breakdown voltage | 120 volts. |
| Collector base capacitance | 2 pf. at 2 volts. |
| Emitter base capacitance | 2.4 pf. at 2 volts. |
| Collector substrate capacitance | 2.1 pf. at 2 volts. |

It should be noted that the substrate on which the epitaxial layer is grown in accordance with the present invention can be, itself, an epitaxial layer or any other layer of semiconductive material suitable as the impurity host. The term "substrate" is employed in the appended claims in this sense.

Figure 1H:
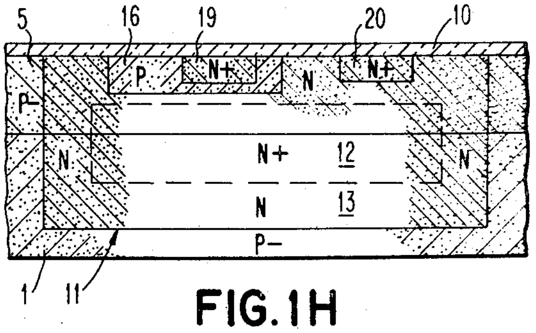

A self-isolated bipolar transistor made in accordance with the present invention possesses the advantage of reduced colector-to-substrate isolation capacitance whereby operation at high frequencies is enhanced. The reduced isolation capacitance as well as the retrograded collector impurity profile previously discussed are direct consequences of the formation of an out-diffused N impurity pocket within a location which is entirely interfaced by $P^-$ semiconductor host material. As shown in FIG. 1H, for example, collector-to-substrate isolation is provided by the junction between N region 13 on the one hand and $P^-$ epitaxial layer 5 and $P^-$ substrate 1 on the other hand.

Low resistivity $N^+$ buried layer 12, as is well understood, reduces collector resistance and thereby reduces collector saturation voltage in the case where a bipolar transistor is formed within the isolated N pocket 11 as in the disclosed embodiment of the invention. Said buried layer optionally may be omitted where, for example, a diffused resistor is formed within the isolated N pocket. If the $N^+$ buried layer is included within the isolated pocket, it does not interface with the $P^-$ semiconductor material in which it is formed. The intervening N material 14 which everywhere separates the $N^+$ material from the $P^-$ material provides an $N/P^-$ isolation junction having reduced isolation capacitance which improves the high frequency performance of the circuit device which is formed within the isolated N pocket.

While this invention has been particularly described with reference to the preferred embodiments thereof, it will be understood that those skilled in the art that the foregoing and other changes in form and details may be made therein without departing from the spirit and scope of the invention.

What is claimed is:

1. A method for making monolithic semiconductor devices comprising the steps of:

providing a semiconductor substrate of one conductivity type, introducing two different impurities of different diffusion rates and of the other conductivity type into said substrate through each of a plurality of desired surface locations, forming an epitaxial layer of semiconductor material on said substrate and over said locations, said epitaxial layer being of the same conductivity type as said substrate, and heating said epitaxial layer and said substrate to outdiffuse one of said impurities completely through said epitaxial layer to reach the surface of said epitaxial layer opposite the interface between said epitaxial layer and said substrate.

2. The method defined in claim 1 and further comprising the steps of forming at one of said desired surface locations a first semiconductor device wholly within the region of said epitaxial layer through which said one of said impurities has outdiffused completely through said epitaxial layer to reach said surface of said epitaxial layer opposite said interface and forming a second semiconductor device outside said region.

3. The method defined in claim 2 wherein said first semiconductor device is an NPN bipolar transistor.

4. The method defined in claim 2 and further comprising the step of forming at each of a plurality of said desired surface locations a respective semiconductor device wholly within the respective region of said epitaxial layer through which said one of said impurities has outdiffused completely through said epitaxial layer to reach said surface of said epitaxial layer opposite said interface.

5. The method defined in claim 1 wherein the concentration of the impurity having the lower diffusion rate is greater than the concentration of the impurity having the higher diffusion rate.

6. The method defined in claim 5 wherein said impurity having the lower diffusion rate outdiffuses through said epitaxial layer to an extent insufficient to reach said surface of said epitaxial layer opposite said interface.

7. The method defined in claim 1 wherein said impurities having said lower and higher diffusion rates comprise arsenic and phosphorus, respectively.

8. The method defined in claim 1 and further including the step of forming at least one semiconductor device wholly within the region of said epitaxial layer through which said impurity has out-diffused completely through said epitaxial layer to reach said surface of said epitaxial layer opposite said interface.

9. The method defined in claim 8 wherein said semiconductor device comprises a bipolar transistor.

References Cited

UNITED STATES PATENTS

| | | | |
|---|---|---|---|
| 3,244,950 | 4/1966 | Ferguson | 317—235 |
| 3,293,087 | 12/1966 | Porter | 148—175 |
| 3,089,794 | 5/1963 | Marinace | 148—1.5 |
| 3,220,896 | 11/1965 | Miller | 148—175 X |
| 3,260,624 | 7/1966 | Wiesner | 148—175 |
| 3,397,326 | 8/1968 | Gallagher et al. | 317—235 X |
| 3,440,503 | 4/1969 | Gallagher et al. | 317—235 |
| 3,479,233 | 11/1969 | Lloyd | 148—174 |
| 3,481,801 | 12/1969 | Hugle | 148—175 |
| 3,502,951 | 3/1970 | Hunts | 317—235 |
| 3,506,893 | 4/1970 | Dhaka | 317—235 |

FOREIGN PATENTS

| | | | |
|---|---|---|---|
| 1,109,201 | 4/1968 | Great Britain | 148—175 UX |

OTHER REFERENCES

Hilbiber, D. F.: "High-Performance Lateral . . . Integrated Circuits," IEEE Trans. on Electron Dev., vol. 60-14, No. 7, July 1967, pp. 381-385.

Ashar et al.: "Semiconductor Device Structure and Method of Making," IBM Tech. Discl. Bull., vol. 11, No. 11, April 1969, pp. 1529-30.

L. DEWAYNE RUTLEDGE, Primary Examiner

W. G. SABA, Assistant Examiner

U.S. Cl. X.R.

29—576; 117—201, 213; 148—187, 190, 191; 317—235 R